PHOTO DEVICE AMPLIFIER CIRCUIT

Filed Nov. 23, 1951

INVENTOR
Jerome Kurshan
BY H. D. Newton [signature]
ATTORNEY

United States Patent Office
2,745,021
Patented May 8, 1956

2,745,021

PHOTO DEVICE AMPLIFIER CIRCUIT

Jerome Kurshan, Princeton, N. J., assignor to Radio Corporation of America, a corporation of Delaware Application November 23, 1951, Serial No. 257,888

5 Claims. (Cl. 250—211)

This invention relates generally to amplifier systems and particularly relates to a stabilized transistor amplifier circuit especially suitable for amplifying the output signal derived from a photo-conductive device.

It is known that a transistor amplifier circuit of the grounded emitter configuration tends to be unstable. A transistor amplifier circuit of the grounded emitter configuration may be defined as a circuit where the emitter is effectively grounded for signal frequency currents while the input signal is impressed on the base and the output signal is derived from the collector, the emitter being the common input and output electrode. The ground need not be in actual earth connection but if all points shown as ground are connected to a common junction point, the operation will be substantially the same. If the transistor has a current gain larger than unity, the impedance existing between the base electrode and ground, or the impedance looking into the base electrode, may become negative under certain operating conditions. The current gain is greater than unity when the short-circuit collector current increments are larger than the corresponding emitter current increments. With such a current gain, which is present in most point contact transistors, and under certain bias conditions, the resistance which appears looking into the base electrode of a grounded emitter transistor amplifier may become negative. Consequently, if such a transistor is used as an amplifier, it tends to become unstable.

It is accordingly an object of the present invention to provide an improved stabilized transistor amplifier circuit of the grounded emitter configuration.

The output current obtained from most photo-conductive devices in response to illumination is insufficient to operate a relay or other utilization device. Accordingly, it would be desirable to provide an amplifier circuit for a photo-conductive device, that is, a device having a resistance which varies as a function of illumination. Such photo-conductive devices may, for example, consist of a semi-conducting crystal such as germanium provided with a semi-transparent metallic film.

It is accordingly a further object of the present invention to provide a transistor amplifier circuit for a photo-conductive device which will develop an output current or signal of appreciable magnitude.

Another object of the invention is to provide a system for coupling a photo-conductive device to a normally unstable base input transistor amplifier whereby an amplified output signal may be derived as a continuous, smooth function of the illumination of the photo-conductive device.

In accordance with the present invention, a transistor amplifier circuit of the grounded emitter configuration is stabilized by connecting a non-linear resistance device between the base and the emitter, the latter being grounded. The positive resistance of the non-linear resistance device should be larger than the largest negative resistance which appears looking into the base. The transistor should also be biased so that short-circuit collector current increments are larger than the emitter current increments and the base resistance should be negative. It has been found in accordance with the present invention that such a non-linear resistance device having a resistance which decreases in response to an increase of the voltage existing across the device will stabilize the grounded emitter transistor amplifier.

Preferably a photo-conductive device having a non-linear resistance of the type defined is connected to the base electrode, that is, between base and ground while the emitter is grounded. In that case, the collector current will decrease in response to illumination of the photo-conductive device. A utilization device such, for example, as a relay may be connected in the collector circuit and the relay may be arranged to actuate a utilization or output circuit upon decrease of the collector current in response to an increase of the illumination of the photo-conductive device.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
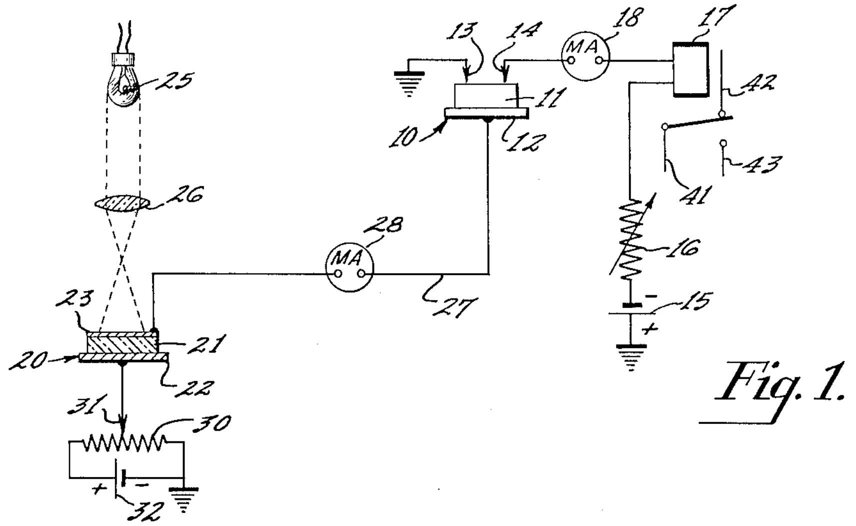
Figure 1 is a circuit diagram of a transistor amplifier circuit for a photo-conductive device embodying the present invention.

Referring now to the drawing, Figure 1 illustrates an amplifier circuit in accordance with the present invention including transistor 10. Transistor 10 includes semi-conducting body 11 which may, for example, consist of germanium and three electrodes, that is, base 12, emitter 13 and collector 14 in contact with body 11. Emitter 13 and collector 14 are in rectifying contact with body 11 while base 12 is in low-resistance or ohmic contact therewith. Since transistors as illustrated at 10 are generally known, a further description thereof is not believed to be necessary.

Transistor 10 is connected as a grounded emitter amplifier and accordingly emitter 13 is connected to a junction point or ground as shown. An output circuit is connected between collector 14 and ground and includes a battery 15, resistor 16 and relay 17 connected in series. A current meter 18 may also be included in the collector output circuit for measuring the collector current for a purpose to be explained more in detail hereinafter. Battery 15 is poled in such a manner that a voltage in the reverse direction is impressed between collector 14 and base 12 as is conventional. In other words, if body 11 is of the N type, collector 14 should be negative with respect to base 12. However, if body 11 should be of the P type, the polarity of battery 15 should be reversed. Resistor 16 may be adjustable as shown for a purpose to be explained hereinafter.

A non-linear resistance device generally indicated at 20 is connected in accordance with the present invention in the base circuit, that is, between base 12 and emitter 13 or ground. Non-linear resistance device 20 should have a positive resistance which decreases in response to an increase of the voltage existing across the device. For example, a crystal rectifier will have such a resistance characteristic. Preferably, however, device 20 is a photo-conductive device. Thus, device 20 may consist of a semi-conducting body 21 which again may consist of germanium. Body 21 is provided with an electrode 22 in low-resistance or ohmic contact with body 21 and with a semi-transparent metallic film 23. The electrode 22 may, for example, consist of a suitable support of metal soldered to body 21. Semi-transparent metallic film 23 may be illuminated by a light source, which may have all or part of its energy in the infra-red or ultra-violet wave lengths, indicated at 25 which is directed on film 23 through lens 26.

Photo-conductive device 20 may, for example, have a germanium body 21 and a metallic film 23 consisting, for example, of gold, copper or nickel. In that case, the photo device will be photovoltaic but also shows photo-conductive properties. Preferably, however, the metallic film 23 consists of bismuth or antimony, in which case a photo-conductive device is obtained. Such a photo-conductive device, however, forms no part of the present invention.

Metallic film 23 is connected to base 12 through conductor 27 and a current meter 28 may be provided in lead 27 to measure the base current. Electrode 22 is connected to ground through potentiometer resistor 30 provided with a slider 31, a battery 32 being connected across resistor 30 having one terminal grounded as shown. Battery 32 is poled so as to apply a voltage in the forward direction between emitter 13 and base 12. If body 11 is again of the N type, emitter 13 should be positive with respect to base 12, and if body 11 is of the P type, the polarity should be reversed. In view of the voltage drop which occurs across device 20, the voltage of base 12 could be negative by several volts. Accordingly, battery 32 should be positive with respect to ground so that base 12 is maintained at a negative potential with respect to grounded emitter 13 of approximately 0.1 volt.

As explained hereinbefore, most point contact or type A transistors have a current gain which is greater than unity. The same applies to certain junction type transistors. With the proper bias voltages applied by batteries 15 and 32, the resistance which appears looking into base 12 of a grounded emitter transistor amplifier becomes negative.

Figure 3:
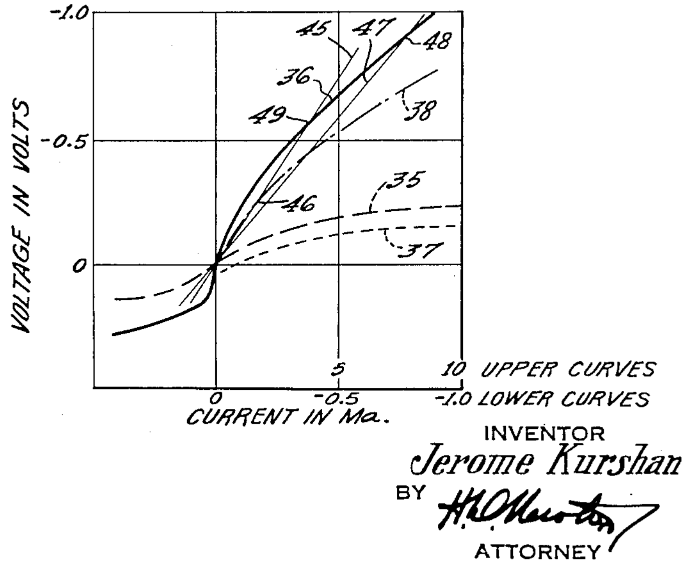
Figure 3 is a graph illustrating the current developed by the photo-conductive device included in the circuit of Figure 1 as a function of the applied voltage, several curves being shown to illustrate the effect of light on the photo-conductive device.

In accordance with the present invention, it has been found that a grounded emitter transistor amplifier may be stabilized by a device such as shown at 20 having a non-linear resistance. The current-voltage characteristic of photo-conductive device 20 not connected to a transistor amplifier is illustrated in Figure 3. Curves 35 and 36 indicate the current of a photo-conductive device without illumination, the device consisting of a body of germanium having a semi-transparent film of bismuth.

Curve 35 relates to the lower current scale and curve 36 to the upper current scale. In other words, curve 36 is drawn to a larger current scale, and indicates an output current of the order of 10 milliamperes (ma.). In the presence of illumination, the current obtained for the same voltage increases as illustrated by curves 37 and 38, curve 37 relating to the lower current scale and curve 38 to the upper current scale. It has been found that such a photo-conductive device has an output current of the order of 1 ma. per lumen of tungsten light having a temperature of 2800° K. (degrees Kelvin).

The resistance of non-linear device 20 at various operating points may be found, for example, from curves 36 and 38. The resistance is measured by the slope of a line such as lines 45 and 47 from the origin to a point on one of the curves. It is seen that at point 48 where line 47 and curve 36 intersect the device has a lower resistance yet a higher voltage and current than at point 49 where line 45 and curve 36 intersect since line 47 has a smaller slope than line 45. Moreover, if on illumination, the operating point of device 20 shifts from point 48 on curve 36 to point 46 on curve 38, the resistance increases and the current and voltage decrease as a result of the incident energy. This relationship exists because of the non-linearity of curves 36 and 38 which resemble in general the voltage-current curves obtainable from a crystal rectifier.

In accordance with the present invention it has been found that in the circuit of Figure 1 the base current, which is also the current flowing through photo-conductive device 20, decreases and that the resistance of device 20 increases in response to illumination. As clearly shown by the curves of Figure 3, photo-conductive device 20 by itself has an increased current at constant voltage due to illumination. Curve 40 of Figure 2 indicates the collector current in milliamperes obtained from the amplifier of Figure 1 as a function of the relative light intensity. This curve shows that the collector current also decreases in response to illumination of photo-conductive device 20. It has further been found that the non-linear resistance characteristic of photo-conductive device 20 stabilizes the grounded emitter transistor circuit which is normally unstable.

The circuit of Figure 1 is preferably adjusted in the following manner: In the absence of illumination slider 31 is moved from the grounded position. The base current as measured by current meter 28 will increase at first, then reach a maximum and finally will decrease again. Accordingly, slider 31 is positioned to provide substantially maximum base current corresponding to substantially maximum sensitivity of the amplifier circuit. In the same manner, the collector current as measured by current meter 18 will decrease slowly at first and then rapidly as the maximum of the base current is exceeded. Accordingly, the resistance of resistor 16 may have to be readjusted to obtain the desired value of the collector current. As shown by curve 40 of Figure 2, the collector current, and also the base current, will decrease in response to illumination of photo-conductive device 20.

By way of example, the circuit of Figure 1 may be adjusted in the absence of light for a collector current of 2.97 ma., a base current of 1.71 ma. and a voltage across device 20 of 0.56 volt. With illumination the collector current will decrease to 1.83 ma., the base current to 1.42 ma. and the voltage across device 20 to 0.51 volt. Accordingly, the resistance of device 20 without illumination is 327 ohms which increases to 359 ohms in response to illumination.

Figure 2:
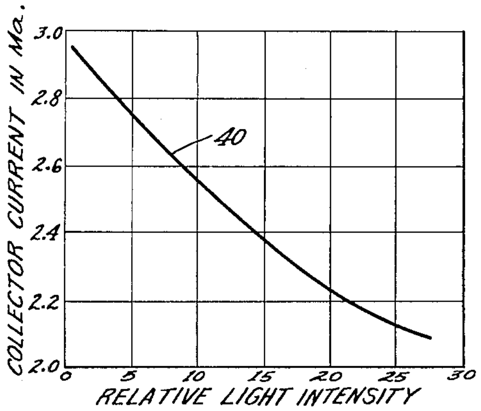
Figure 2 is a graph illustrating the collector current of the amplifier circuit of Figure 1 as a function of the relative light intensity.

It has been found that if device 20 is replaced by a variable linear resistor having, for example, the values above given, the circuit of Figure 1 will not behave as indicated by curve 40 of Figure 2. Without a non-linear resistance device, the collector current varies discontinuously and in the opposite direction. This clearly indicates that a non-linear resistance device is required to stabilize the circuit of Figure 1.

Relay 17 may, for example, be adjusted to be normally closed and to open when the collector current decreases below, for example, 2.9 ma. A utilization circuit may, for example, be connected to conductors 41 and 42 or to conductors 41 and 43 to either open or close the utilization circuit in response to illumination. The positive resistance of photo-conductive device 20 should exceed the negative resistance which appears looking into base 12.

There has thus been disclosed a stabilized transistor amplifier circuit of the grounded emitter configuration. This circuit is particularly suitable for amplifying the output signal or current obtained from a photo-conductive device. With the amplifier of the invention an amplified output signal is obtained which is a continuous, smooth function of the illumination of the photo-conductive device.

What is claimed is:

1. An amplifier circuit for a photo-conductive device comprising a photo-conductive device having a non-linear resistance which decreases in response to an increase of the voltage existing across said device, a transistor including a semi-conducting body, a base electrode, an emitter electrode and a collector electrode in contact with said body, a first source of potential, said first source and said device being connected in series between a junction point and said base electrode, means connecting said emitter electrode to said junction point, a second source of potential, and an output circuit connected in series with said second source between said junction point and said collector electrode, said first source being adjusted to provide substantially maximum base current, whereby the collector current decreases in response to illumination of said photo-conductive device.

2. A circuit as defined in claim 1 wherein said photo-conductive device comprises a body of germanium, a semi-transparent metallic film provided on one surface of said germanium body, a first electrode in ohmic contact with said germanium body, and a second electrode in contact with said film.

3. An amplifier circuit for a photo-conductive device comprising a photo-conductive device including a first semi-conducting body, a semi-transparent metallic film provided on one surface of said first body, a first electrode on ohmic contact with said first body, a second electrode in contact with said film; a transistor including a second semi-conducting body, a base electrode, an emitter electrode and a collector electrode in contact with said second body, a first source of voltage connected between a junction point and said first electrode, a conductor connecting said second electrode to said base electrode, a further conductor connecting said emitter electrode to said junction point, a second source of voltage, and an output circuit connected serially with said second source between said junction point and said collector electrode, said first source being adjusted to provide substantially maximum base current, whereby the collector current decreases in response to illumination of said film.

4. An amplifier circuit for a photo-conductive device comprising a photo-conductive device including a first body of germanium, a semi-transparent film of a metal selected from the group consisting of bismuth and antimony provided on one surface of said first body, a first electrode in ohmic contact with said first body, a second electrode in contact with said film; a transistor including a second semi-conducting body of the N type, a base electrode, an emitter electrode and a collector electrode in contact with said second body, a first source of voltage having its negative terminal connected to a junction point and its positive terminal connected to said first electrode, a conductor connecting said second electrode to said base electrode, a further conductor connecting said emitter electrode to said junction point, a second source of voltage having its positive terminal connected to said junction point, and an output circuit connected between the negative terminal of said second source and said collector electrode, said first source being adjusted to provide substantially maximum base current, whereby the collector current decreases in response to illumination of said film.

5. An amplifier circuit for a photo-conductive device comprising a photo-conductive device including a first body of germanium, a semi-transparent film of a metal selected from the group consisting of bismuth and antimony provided on one surface of said first body, a first electrode in ohmic contact with said first body, a second electrode in contact with said film; a transistor including a second semiconducting body, a base electrode, an emitter electrode and a collector electrode in contact with said second body, said transistor having, under proper operating conditions, short-circuit collector current increments which are larger than the emitter current increments and having a resistance looking into said base electrode which is negative, means for establishing said proper operating conditions including a first source of voltage connected between a junction point and said first electrode and a second source of voltage, a conductor connecting said second electrode to said base electrode, a further conductor connecting said emitter electrode to said junction point, said first source being poled to apply a voltage in the forward direction between said emitter and base electrode, and an output circuit connected serially with said second source between said junction point and said collector electrode, said second source being poled to apply a voltage in the reverse direction between said collector and base electrodes, said first source being adjusted to provide substantially maximum base current, whereby the collector current decreases in response to illumination of said film.

References Cited in the file of this patent

UNITED STATES PATENTS

| | | |
|---|---|---|
| 2,233,788 | Lewin | Mar. 4, 1941 |
| 2,309,329 | Powers | Jan. 26, 1943 |
| 2,486,776 | Barney | Nov. 1, 1949 |
| 2,499,889 | Teichmann | Mar. 7, 1950 |
| 2,540,144 | Stern | Feb. 6, 1951 |
| 2,560,606 | Shive | July 17, 1951 |